United States Patent [19]

Kauppila

[11] 3,733,685

[45] May 22, 1973

[54] METHOD OF MAKING A PASSIVATED WIRE BONDED SEMICONDUCTOR DEVICE

[75] Inventor: James E. Kauppila, Troy, Mich.

[73] Assignee: General Motors Corporation, Detroit, Mich.

[22] Filed: May 3, 1971

[21] Appl. No.: 139,733

Related U.S. Application Data

[62] Division of Ser. No. 778,625, Nov. 25, 1968, Pat. No. 3,629,669.

[52] U.S. Cl. ..................29/470.1, 29/471.1, 29/475, 29/628

[51] Int. Cl. ..........................................B23k 21/00

[58] Field of Search..........................29/471.1, 470.1, 29/497.5, 475, 589, 628

[56] References Cited

UNITED STATES PATENTS

| | | | |
|---|---|---|---|
| 3,028,663 | 4/1962 | Isversen et al. | 29/470.1 X |
| 3,087,239 | 4/1963 | Clagett | 29/471.1 |
| 3,235,945 | 2/1966 | Hall, Jr. et al. | 29/470.1 X |
| 3,330,026 | 7/1967 | Best et al. | 29/470.1 |
| 3,397,451 | 8/1968 | Avedissian | 29/471.1 X |
| 3,444,612 | 5/1969 | Pennings | 29/471.1 |
| 3,610,506 | 10/1971 | Robinson | 29/470.1 X |

*Primary Examiner*—Richard Bernard Lazarus
*Attorney*—Robert J. Wallace

[57] ABSTRACT

A semiconductive device is described in which electrical contact is made with the semiconductor surface through a rupture in an overlying frangible dielectric coating. Contact is achieved by forming an electrode pad on the semiconductor surface, coating the surface of the semiconductor and the electrode pad with a frangible layer of dielectric, forming a terminal connector contact pad on the dielectric coating over the electrode pad, rupturing the dielectric layer to communicate the pads, and bonding a terminal lead to the connector contact pad. In a preferred embodiment, the rupturing and bonding steps are simultaneously achieved by compression bonding a terminal wire to the connector contact pad.

6 Claims, 5 Drawing Figures

INVENTOR.
James E. Kauppila
BY
R. J. Wallace
ATTORNEY

METHOD OF MAKING A PASSIVATED WIRE BONDED SEMICONDUCTOR DEVICE

RELATED PATENT APPLICATION

This application is a division of United States patent application Ser. No. 778,625 now U.S. Pat. No. 3,629,669 entitled "Passivated Wire Bonded Semiconductor Device," filed Nov. 25, 1968, in the name of James E. Kauppila, and assigned to the assignee of this application.

BACKGROUND OF THE INVENTION

Dielectric coatings are used on the surface of many semiconductor devices. Dielectric coatings are used as an active element in metal-insulator-semiconductor field effect devices, and as a passivating coating in junction semiconductor devices such as transistors, rectifiers and the like. Silicon dioxide and silicon nitride are conventionally used in these applications because they are readily configured to precise surface geometrics by photolithographic masking and etching processing techniques. Many other, more desirable dielectrics are so chemically inert that they are not amenable to such processing. Hence, the use of these other dielectrics is limited.

It would be highly desirable, for example, to use a dielectric such as tantalum oxide in producing an insulated gate field effect transistor. However, tantalum oxide is so resistant to chemical attack by etchants that conventional, economical techniques cannot be used to make devices with such a dielectric. Moreover, the more costly unconventional techniques may not even be adequate to produce the precise surface geometrics required in miniature devices for monolithic microcircuits.

Also, it appears that other dielectrics may be more effective in passivating the surface of junction semiconductor devices than silicon dioxide and silicon nitride. However, the practical and processing problems incident to their use normally offset the inherent benefits that might be realized.

If one could at least reliably and economically precisely make very small apertures in these other dielectrics, their commercial use could be considerably enlarged. Such apertures are necessary to make contact with the underlying semiconductor surface. I have found an even better technique, a technique in which no such aperture at all need be specially produced.

In my technique, the dielectric is sandwiched between two ductile metal pads and ruptured in the interfacial area to provide electrical communication through the dielectric coating. This technique is not only useful for making contacts through dielectrics such as tantalum oxide but also useful in making contacts through the more conventional dielectrics such as silicon dioxide and silicon nitride. Hence, my technique eliminates the need for photolithographic masking and etching. In addition, it provides greater flexibility in processing because it permits complete interchangeability of dielectrics. In either making insulated gate field effect devices or passivating junction devices, the dielectric with the most desirable properties can be selected and used. Moreover, that dielectric can be replaced by any other dielectric, without changing anything else in the processing.

SUMMARY OF THE INVENTION

It is, therefore, an object of this invention to provide an improved method for making a semiconductive device electrical connection through a passivating coating on the surface of a semiconductive body. It is a further object of the invention to provide a technique for contacting a semiconductive surface directly through an insulating coating.

These and other objects of the invention are attained by forming an electrode pad on a selected surface area of a semiconductive element, coating the surface of the semiconductive element and the electrode pad with a layer of a brittle dielectric, forming a terminal connector contact pad on the dielectric coating over the electrode pad, compressing a central portion of the connector contact pad to rupture the brittle dielectric layer and connect the connector contact pad and electrode pad together, and bonding a connector to the connector contact pad. If the contact pads and dielectric coating are of a selected thickness relationship, the dielectric layer can be ruptured and the two contact pads connected, by simply compression bonding a terminal wire to the connector pad.

BRIEF DESCRIPTION OF THE DRAWING

Other objects, features and advantages of the invention will become more apparent from the following description of preferred examples thereof and from the drawing, in which.

DESCRIPTION OF THE PREFERRED EMBODIMENTS

Figure 1:
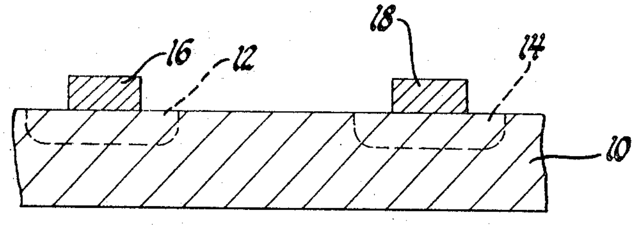
FIGS. 1–4 show fragmentary sectional views illustrating four successive stages in making an insulated gate field effect transistor in accordance with the invention.

This invention is particularly useful in making an insulated gate field effect transistor. FIG. 1 shows a semiconductive element 10, having source region 12 and drain region 14 with respective overlying low resistance electrode pads 16 and 18, all produced by conventional oxide masking and photolithographic techniques. The source and drain electrode pads 16 and 18 are of evaporated aluminum, about 0.5 micron thick, and are in ohmic contact with their respective source and drain regions 12 and 14.

Figure 2:
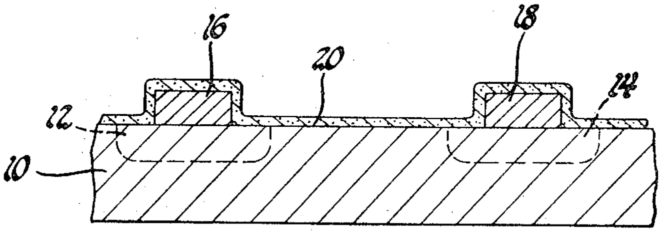

As shown in FIG. 2 a continuous 0.1 micron thick film 20 of tantalum oxide ($Ta_2O_5$) is reactively sputtered onto the entire surface of the semiconductive element 10, including electrode pads 16 and 18.

Figure 3:
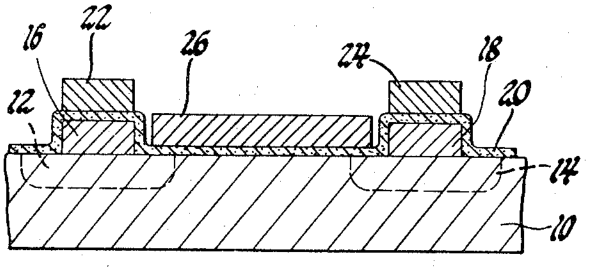

Referring now to FIG. 3, terminal connector contact pads 22 and 24 are evaporated onto the surface of dielectric film 20 over the source and drain electrode pads 16 and 18, respectively. The contact pads 22 and 24 are of the same configuration as and in register with their corresponding electrode pads and of about 0.5 micron in thickness. An aluminum gate electrode-connector pad 26 of similar thickness is simultaneously evaporated onto film 20 between the source and drain contact pads 22 and 24.

Figure 4:
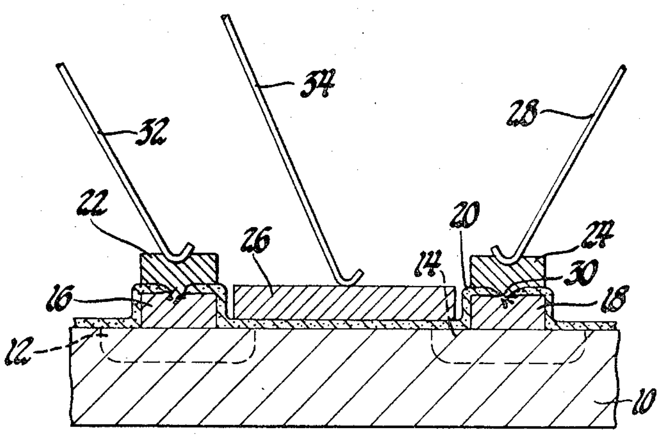
Figure 5:
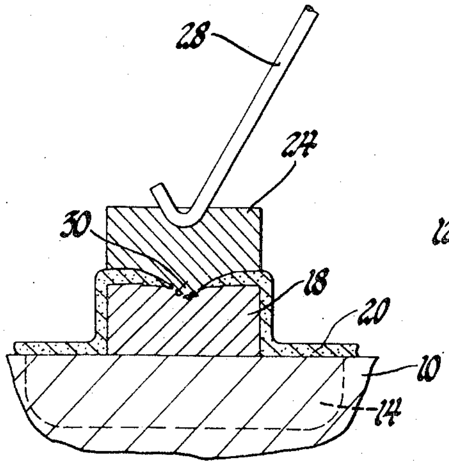
FIG. 5 shows an enlarged fragmentary sectional view of the drain electrode area of the insulated gate field effect transistor shown in FIG. 4.

FIG. 4 shows the device after thermocompression bonding of 1 mil diameter gold terminal lead wires 28, 32 and 34 to their respective contact pads. In the thermocompression bonding area the cross-sectional area of a 1 mil length of the gold wire is reduced about 20 – 70 percent. In bonding gold wire 28 by this technique to drain contact pad 24, the subjacent portion of the dielectric film 20 sandwiched between contact pad 24 and electrode 18 ruptures at 30. Upon rupture, the metal of the two contact pads are pressed into contact with one another and bond together, providing a low resistance connection between terminal wire 28 and drain region 14. A 1 mil gold wire 32 is similarly thermocompression bonded to source connector pad 22 and thereby electrically connected to source region 12. A 1 mil gold wire 34 is also similarly bonded to the insulated gate electrode-connector pad 26. However, gate electrode-connector pad 26 does not have a readily deformable electrode pad underneath it. Consequently, when wire 34 is bonded to it, film 20 does not rupture and remains continuous and insulating.

Film 20 can be made of any brittle dielectric which has dielectric properties electrically suitable for the particular device which is being made. Dielectrics such as tantalum oxide, silicon dioxide and silicon nitride can be used as well as any other brittle dielectric, particularly those having a Moh hardness of about 7 or greater.

The electrode and the terminal connector contact pads are preferably of a ductile metal such as gold, platinum and aluminum to permit the deformations necessary to rupture the dielectric film. The particular metal used should be softer than the dielectric and preferably of Moh hardness of no more than about ½ that of the dielectric. It is preferred that both the electrode and contact pads be made of the same metal, or at least of metallurgically compatible metals. In such instance, the thermocompression bonding of the connector wire to the contact pads cannot only produce a mechanical but also a chemical bonding between the two pads, insuring acquisition of a low resistance connection.

The electrode pads 16 and 18 on the semiconductor surface must be of sufficient thickness to provide adequate deformation to rupture the dielectric film and allow intimate association with the metal of the overlying contact pad. This minimum thickness is principally dependent on the thickness of the dielectric film. It should be at least as thick as the dielectric coating and preferably twice as thick. For dielectric coatings of approximately 0.1 micron, I would use at least 0.2 micron electrode pad thicknesses. However, to insure that a sufficient thickness is achieved, I prefer to use electrode pad thicknesses of about 0.5 micron. Little advantage is ordinarily gained in using higher relative thicknesses.

As indicated in the preceding paragraph, the dielectric film thickness primarily determines the minimum thickness of the underlying electrode pad. For insulated gate field effect transistors I prefer to use a dielectric thickness of about 0.05 – 0.15 micron. However, if the dielectric coating is to be used in passivating the surface of a junction semiconductor device, the dielectric coating should be of the order of 1 micron. In such instance the underlying contact pad should be at least about 2 microns, but not significantly greater. Little advantage is realized in using dielectric thicknesses of the order of 10 microns.

The minimum thickness of the terminal connector contact pad on top of the dielectric film is principally determined by the amount of metal necessary to achieve an adequate terminal connection. For thermocompression bonding, for example, a thickness of at least 0.1 micron is necessary and preferably 0.2 – 0.5 micron. Thicknesses in excess of this tend to unduly increase the rupturing pressure required and for that reason are not preferred. The area of pressure should be well within the area of pad registration and only of limited dimension to insure rupture at a low pressure, well within the area of pad registration.

It is to be appreciated that the maximum benefit of this invention is to be obtained where the terminal connector wire and the fracture of the dielectric coating under the contact pad is simultaneously achieved. However, it is recognized that should one choose to do so these two steps can be successively performed. The fracture and the bonding can be readily simultaneously achieved with gold or aluminum wires of up to 3 mil diameter by compression bonding techniques, such as cold welding, ultrasonic bonding and thermocompression bonding. However, I prefer to use thermocompression bonding.

It is to be understood that although this invention has been described in connection with certain specific examples thereof, no limitation is intended thereby except as defined in the appended claims.

I claim:

1. A process for making an electrical connection to a selected surface portion of a semiconductive body through a dielectric coating thereon, which process comprises the step of forming a first ductile metal contact pad on a selected surface area of a semiconductive body, forming a brittle dielectric coating on the surface of said semiconductive body and said pad, said dielectric coating being less than one-half the thickness of said contact pad, forming a second ductile metal contact pad on said dielectric coating over said first contact pad, deforming a limited central area of said second contact pad against the first contact pad to fracture the interjacent dielectric coating and electrically communicate said first and second contact pads through said fracture, and bonding a terminal connector to said second contact pad.

2. The process as defined in claim 1 wherein the dielectric coating is approximately 0.05 – 1.0 micron thick, the first and second contact pads are of the same metal, and the deforming and bonding steps are simultaneously performed by compression bonding a terminal lead wire to the second contact pad.

3. The process as defined in claim 2 wherein the compression bonding technique is selected from the class consisting of thermocompression bonding and ultrasonic bonding.

4. The method as defined in claim 1 wherein the dielectric coating is approximately 0.05 – 0.2 micron in thickness and the contact pads are about 0.2 – 0.5 micron in thickness.

5. The method as defined in claim 4 wherein the dielectric coating is of nonconductive, relatively inert, brittle material such as tantalum oxide, the contact pads are of a ductile metal such as aluminum, the terminal connector is a wire of a ductile metal such as selected from the class consisting of gold and aluminum, the terminal wire is of a thickness of less than about 3 mils, and the deforming and bonding steps are simultaneously performed by compression bonding the terminal wire to the first contact pad.

6. The process as defined in claim 5 wherein the compression bonding technique is selected from the group consisting of thermocompression bonding and ultrasonic bonding.

* * * * *